US008659448B2

(12) United States Patent
Nakajima

(10) Patent No.: US 8,659,448 B2
(45) Date of Patent: Feb. 25, 2014

(54) MOVEMENT DETECTION DEVICE

(75) Inventor: Hirokatsu Nakajima, Yokkaichi (JP)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 0 days.

(21) Appl. No.: 13/519,436

(22) PCT Filed: Nov. 12, 2010

(86) PCT No.: PCT/JP2010/006650

§ 371 (c)(1),
(2), (4) Date: Jun. 27, 2012

(87) PCT Pub. No.: WO2011/086625

PCT Pub. Date: Jul. 21, 2011

(65) Prior Publication Data

US 2012/0292173 A1 Nov. 22, 2012

(30) Foreign Application Priority Data

Jan. 13, 2010 (JP) ................................. 2010-004501

(51) Int. Cl.
*H03M 1/22* (2006.01)

(52) U.S. Cl.
USPC ........ 341/17; 200/336; 200/568; 324/207.25; 341/15; 341/13; 341/6; 250/231.16; 250/231.18; 250/231.13; 250/231.14

(58) Field of Classification Search
USPC ............ 341/1–17; 200/336, 568; 324/207.25, 324/12.22; 250/231.14, 231.16, 231.18, 250/231.13
See application file for complete search history.

(56) References Cited

U.S. PATENT DOCUMENTS 4,644,157 A * 2/1987 Ozawa et al. ............ 250/231.16
4,786,892 A * 11/1988 Kubo et al. ..................... 341/20
4,993,659 A * 2/1991 Takai et al. ..................... 341/13
5,621,196 A * 4/1997 Nishijima et al. ............ 200/6 A (Continued)

FOREIGN PATENT DOCUMENTS

| | | |
|---|---|---|
| JP | A 2001-250453 | 9/2001 |
| JP | A 2006-164871 | 6/2006 |
| JP | A 2007-257998 | 10/2007 |
| JP | B2 4066037 | 3/2008 |

OTHER PUBLICATIONS

Feb. 15, 2011 International Search Report issued in International Patent Application No. PCT/JP2010/006650 (with translation).

*Primary Examiner* — Lam T Mai
(74) *Attorney, Agent, or Firm* — Oliff, PLC

(57) ABSTRACT

Provided is a rotation detection device that detects a rotational direction and amount of a rotatable operation member. The detection device manages to reduce the rotation detection pitch while maintaining sufficient clearance for a rotation detection switch to operate. In other words, sufficient distance is given between rotation detection members such that the switch can accurately detect the movement from one member to the next. The rotatable operation member generally includes a plurality of switch driving sections that rotate in unison. A rotation detection switch generally includes a portion that moves in a first and second direction opposite to each other when coming into contact with the rotatable operation members, and is configured to output a detection signal at each movement. The switch and rotatable operation members are configured so that the movement direction of the detector is in a direction orthogonal to the circumferential direction of rotation.

13 Claims, 14 Drawing Sheets

(56) References Cited

U.S. PATENT DOCUMENTS

| | | | | |
|---|---|---|---|---|
| 6,130,425 | A * | 10/2000 | Sano | 341/3 |
| 6,541,760 | B2 * | 4/2003 | Ohgoshi et al. | 250/231.13 |
| 6,670,567 | B1 | 12/2003 | Koseki et al. | |
| 6,828,783 | B2 * | 12/2004 | Schroter et al. | 341/15 |
| 6,999,006 | B2 * | 2/2006 | Takeuchi et al. | 341/11 |
| 2006/0132347 | A1 | 6/2006 | Hanahara et al. | |

* cited by examiner

MOVEMENT DETECTION DEVICE

CROSS-REFERENCE TO RELATED APPLICATIONS

This application is the national stage application of PCT/JP2010/006650, international filing date Nov. 12, 2010, and claims priority to JP 2010-004501, filed in Japan on Jan. 13, 2010, the entire disclosure of which are hereby incorporated by reference in its entirety.

BACKGROUND

The present disclosure relates to a rotation detection device that is disposed on a panel in an automobile interior or the like.

Typically, a rotation detection device disposed in an automobile interior or the like includes a rotatable operation member that can be moved, for example rotated while being held with fingers, and a detection device that outputs a detection signal corresponding to the direction and the amount of that relative movement. Although a rotary encoder can be used as the detection device, such a rotary encoder is generally expensive, and, thus, the possibility of detecting the rotation using other devices such as inexpensive switches is being investigated.

Conventionally, a rotation detection device using a switch as shown in FIG. 14 is known (see, e.g., Japanese Patent No. 4066037). This device includes a rotatable operation member 80 that is rotated and a rotation detection switch 84 that is for detecting the rotation.

The rotatable operation member 80 is configured to be rotated while being held with fingers for example and a plurality of driving protrusions 82 that protrude outward in the radial directions from an outer circumferential face of the rotatable knob 81. The driving protrusions 82 are arranged on the outer circumferential face of the rotatable knob 81 at constant intervals in the circumferential direction of the outer circumferential face, and rotate unitarily with the rotatable knob 81.

The rotation detection switch 84 is provided with a switch body 86 and a detector 88 that is attached to the switch body 86 such that the detector 88 can move upward and downward (swing) to the left and right. The driving protrusions 82 are sequentially brought into contact with the detector 88 as the rotatable knob 81 is being rotated, and, at each contact, an operation is repeated in which the detector 88 moves downward from an origin position (upright position) in a direction corresponding to the rotational direction of the rotatable knob 81 (a circumferential direction of rotation of the rotatable knob 81) and then returns to the original origin position. That is to say, the rotation detection switch 84 is disposed in an orientation in which the upward and downward directions of the movement (the directions of swing) of the detector 88 match the circumferential directions of rotation of the rotatable knob 81 and the driving protrusions 82. The switch body 86 generates a detection signal each time the detector 88 moves downward and returns.

Well known switches can be used as the rotation detection switch 84, and Japanese Patent No. 4066037 describes an example of a switch 84 of a two-direction three-contact type as shown in FIG. 15. The switch body 86 of the rotation detection switch 84 shown in FIG. 15 is provided with a casing 90 that has a bottom wall 90*a*, a switch spring 92 that is accommodated in the casing 90, a central contact point 94C and left and right contact points 94A and 94B that are arranged on the bottom wall 90*a*, terminals 95A, 95B, and 95C that respectively correspond to the contact points 94A, 94B, and 94C, a support shaft 96 that is disposed in the upper portion of the casing 90 and forms a swing shaft of the detector 88, and a pair of left and right cam sections 98A and 98B that rotate unitarily with the support shaft 96. This switch is merely exemplary of the type of switches that can be used.

The switch spring 92 can be made of a metal plate capable of being elastically deflected, and both end portions thereof respectively form spring contact points 92*a* and 92*b* that are pressed against the bottom wall 90*a*. The shape of the switch spring 92 is generally set so as to achieve the following operability. That is to say, the switch spring 92 is set so as to be in uniform contact with the cam sections 98A and 98B from below, so that the detector 88 is held at the origin position as shown in the drawing, and, in this state, the spring contact point 92*a* is positioned between the contact points 95A and 95C, and the spring contact point 92*b* is positioned between the contact points 95B and 95C.

In this device, if the rotatable knob 81 is for example rotated in a direction indicated by the arrow 89A in FIGS. 14 and 15, the driving protrusions 82 that rotate unitarily with the rotatable knob 81 are sequentially brought into contact with the detector 88 of the rotation detection switch 84 and move the detector 88 downward in a direction corresponding to the rotational direction (right direction in FIG. 15) (see the dashed double dotted line 88A in FIG. 15). Accordingly, the cam section 98A linked to the support shaft 96 of the detector 88 is lowered, elastically deflecting the switch spring 92 in the direction indicated by the arrow 93A in FIG. 15, and, thus, the two spring contact points 92*a* and 92*b* of the switch spring 92 are caused to slide along the bottom wall 90*a* and are brought into contact with the contact points 94A and 94C. In this manner, conduction is established between the terminal 95A corresponding to the contact point 94A and the terminal 95C corresponding to the contact point 94C via the switch spring 92, and a detection signal indicating that the rotatable knob 81 has been rotated in the direction indicated by the arrow 89A is generated. Subsequently, when the driving protrusion 82 moves past the detector 88, the detector 88 returns to the original origin position due to the elastic return force of the switch spring 92, and the two spring contact points 92*a* and 92*b* of the switch spring 92 are moved away from the contact points 94A and 94C.

On the other hand, if the rotatable knob 81 is rotated in a direction indicated by the arrow 89B in FIG. 14, the detector 88 is moved downward in the direction opposite the previous direction, that is, to the left in FIG. 15. Accordingly, the cam section 98B is lowered, elastically deflecting the switch spring 92 in the direction indicated by the arrow 93B in FIG. 15, and, thus, the spring contact points 92*a* and 92*b* are this time brought into contact with the contact points 94C and 94B respectively, and conduction is established between the terminals 95C and 95B. Accordingly, a detection signal different from the above-described detection signal is generated.

That is to say, in this device, if the rotatable operation member 80 is rotated, detection signals that vary depending on the rotational direction are intermittently generated, and the rotational direction and the rotational amount are recognized based on the type and the number of the detection signals generated.

In rotation detection devices of this sort, it is an important issue to reduce a rotation detection pitch for the rotatable operation member, that is, an arrangement pitch Pt of the driving protrusions 82 for driving the rotation detection switch 84 in the device shown in FIG. 15 (interval between the driving protrusions 82 shown in FIG. 15). A reduction in the rotation detection pitch, that is, the arrangement pitch Pt enables greater precision in detecting the rotational amount with the rotation detection switch 84 without increasing the size of the entire rotatable operation member including the driving protrusions 82. Furthermore, in the case where a click mechanism that generates a click feel in accordance with the rotation detection pitch is provided, it is possible to improve a sense of operation given to the user by reducing the click feel generation pitch.

However, in this device, there is a strict limitation as to the ability to reduce the pitch Pt of the driving protrusions 82 corresponding to the rotation detection pitch, which is based on providing sufficient distance so as to allow a proper swing movement of the detector 88. If the arrangement pitch Pt is too small, then, after one of the driving protrusions 82 is brought into contact with the detector 88 and moves it downward and then releases the detector 88, the next driving protrusion 82 is brought into contact with the detector 88 before the detector 88 returns to the proper origin position (position indicated by the solid line in FIG. 15). Accordingly, a proper return movement of the detector 88 is inhibited, which causes erroneous detection. In other words, in order to ensure a proper downward movement and return movement of the detector 88, the interval between the driving protrusions 82 that are adjacent to each other, that is, the arrangement pitch Pt has to be set larger to some extent than the swing stroke of the detector 88 (the maximum movement distance of the detector 88 in directions orthogonal both to the direction of the support shaft 96, which is a shaft about which the detector 88 swings, and to the radial direction of swing). Accordingly, a strict limitation is imposed on the reduction in the arrangement pitch Pt.

SUMMARY

In view of these circumstances, it is an object of the present disclosure to provide a rotation detection device, including a rotatable operation member and a rotation detection switch that detects rotation of the rotatable operation member, wherein the rotation detection pitch can be reduced while a proper operation of the rotation detection switch is ensured.

The rotation detection device provided by the present disclosure includes a rotatable operation member that is configured to be rotated in both a first rotational direction and a second rotational direction, which is opposite the first rotational direction, about a given operation central axis, and a rotation detection switch that detects a rotational direction and a rotational amount of the rotatable operation member. The rotatable operation member includes a plurality of switch driving sections that are intermittently arranged in a circumferential direction of rotation that corresponds to the rotational direction of the rotatable operation member. The rotation detection switch is provided with a detector and a switch body. The switch body holds the detector such that the detector can move in both a first movement direction and a second movement direction, which are opposite each other, from an origin position at which the detector is in an upright posture, biases the detector toward the origin position, and, each time the detector moves in the first movement direction or the second movement direction by a predetermined amount, outputs a detection signal corresponding to the movement direction. The rotation detection switch is disposed in a posture in which the first movement direction and the second movement direction of the detector are preferably closer to a direction (a radial direction of rotation of the rotatable operation member, or a direction parallel to the operation central axis) orthogonal to the circumferential direction of rotation of the rotatable operation member than to the circumferential direction of rotation at a position where the switch driving sections of the rotatable operation member can be brought into contact with the detector. In other words, the rotation detection switch is preferably configured such that it operates (i.e., swings) in a direction oblique to the relative movement it is attempting to detect. By doing so, at least a portion of the movement of the rotation detection switch is in a direction that is not parallel to the movement direction. Thus, the pitch between the switch driving members can be reduced. Additionally, the switch driving sections of the rotatable operation member are each shaped such that, when brought into contact with the detector as the rotatable operation member is being rotated in the first rotational direction, the switch driving sections move the detector in the first movement direction by at least the predetermined amount and then release the detector, and such that, when brought into contact with the detector as the rotatable operation member is being rotated in the second rotational direction, the switch driving sections move the detector in the second movement direction by at least the predetermined amount and then release the detector.

In this rotatable operation device, the rotation detection switch is disposed such that the movement directions of the detector of the rotation detection switch are preferably closer to a direction orthogonal to the circumferential direction of rotation of the rotatable operation member than to the circumferential direction of rotation, and the switch driving sections of the rotatable operation member are arranged so as to move the detector in the movement directions, and, thus, the required movement distance of the detector in the circumferential direction of rotation is short. Accordingly, while a proper movement of the detector is ensured, the arrangement pitch of the switch driving sections, that is, the rotation detection pitch can be reduced, and the precision in detecting the rotation can be improved.

DETAILED DESCRIPTION OF THE EMBODIMENTS

A rotation detection device according to a first embodiment of the present disclosure will be described with reference to FIGS. 1 to 7.

Figure 1B:
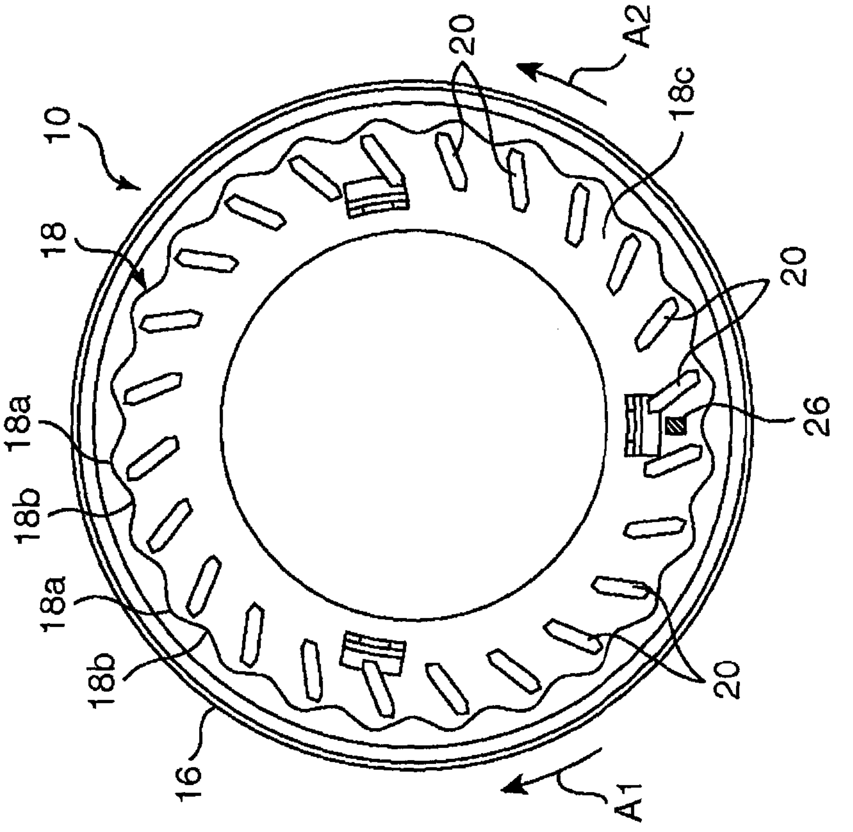
FIG. 1B is a cross-sectional view taken along the line 1B-1B in FIG. 1(*a*).
Figure 1A:
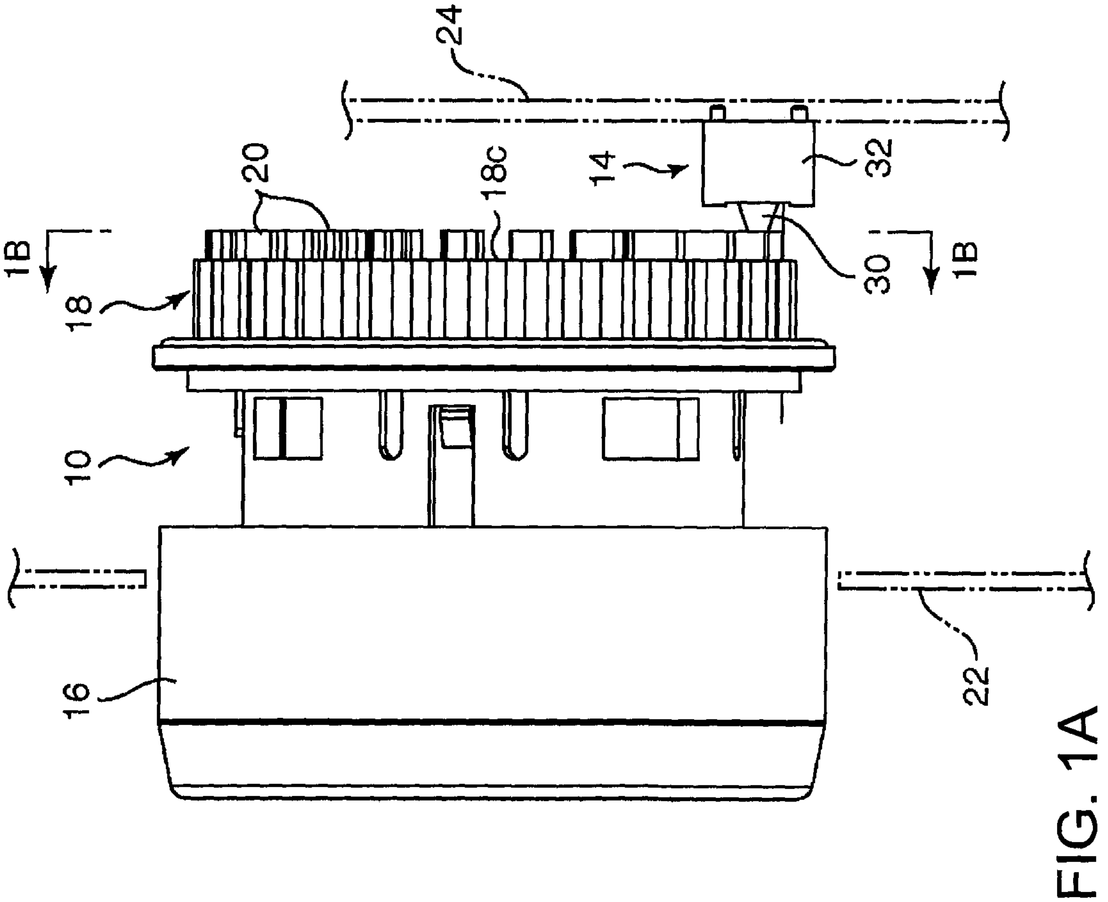
FIG. 1A is a side view of a rotation detection device according to a first embodiment of the present disclosure.
Figure 2:
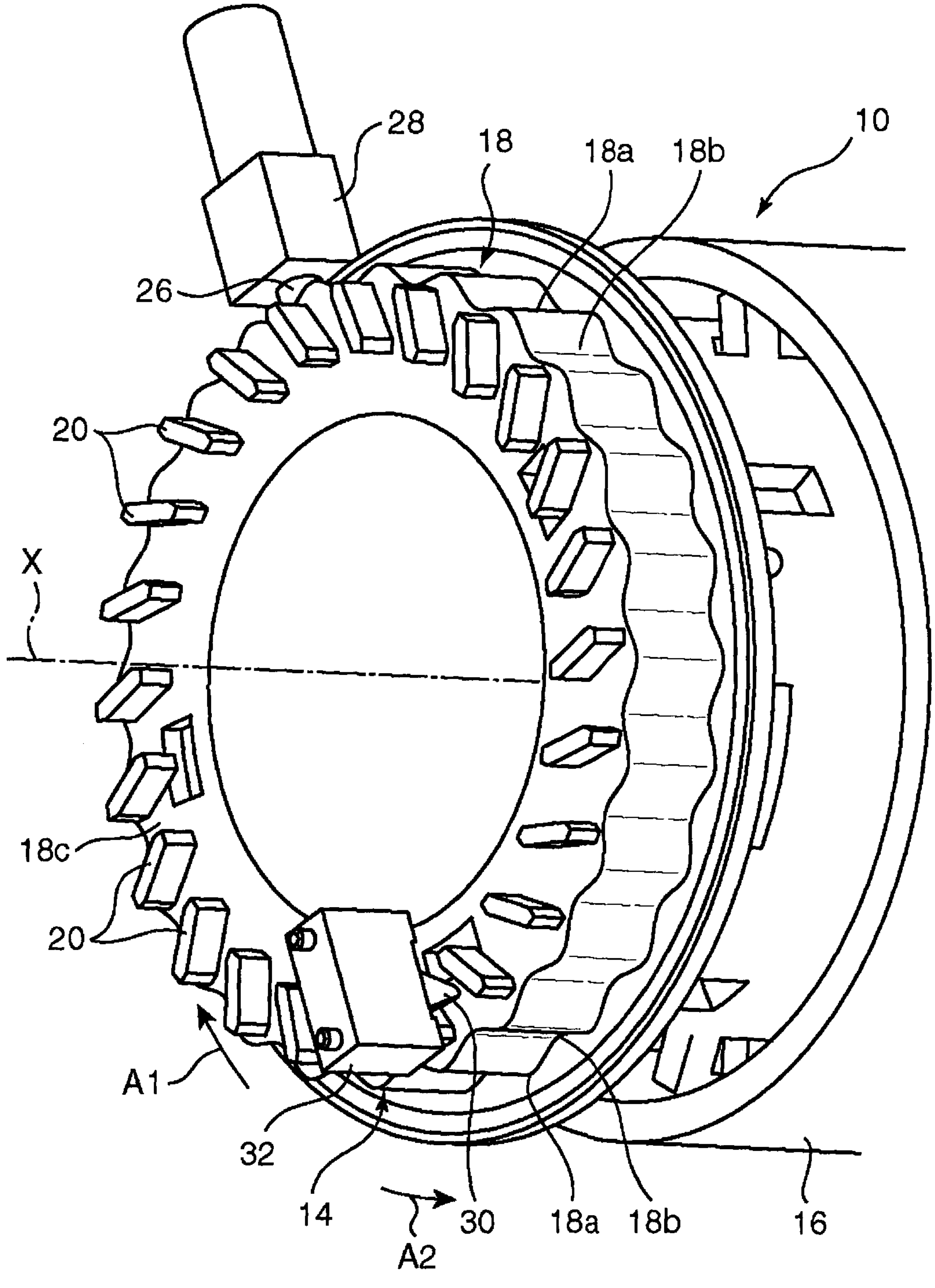
FIG. 2 is a perspective view showing a state where a detector of a rotation detection switch is at its origin position in the rotatable operation device.
Figure 3:
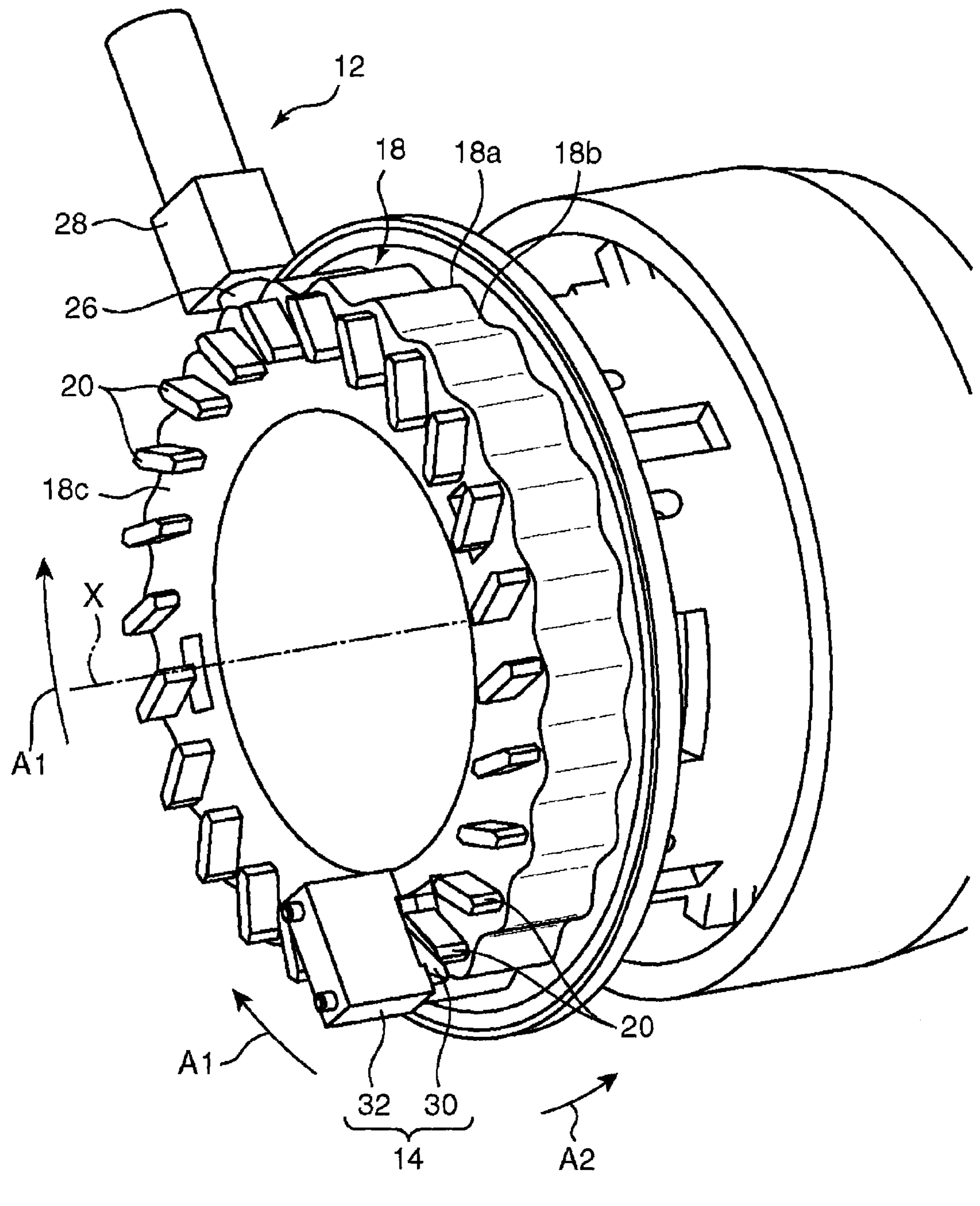
FIG. 3 is a perspective view showing a state where the detector has been moved downward from the origin position.

The rotation detection device shown in FIGS. 1 to 3 is disposed in an automobile interior or the like, and, when it is subjected to a rotational operation, outputs a detection signal corresponding to the direction and the amount of that rotation. This rotation detection device is provided with a rotatable operation member 10 is configured to rotate about an axis, a click mechanism 12 that is configured to generate a click feel in accordance with the rotation (FIGS. 2 and 3), and a rotation detection switch 14 that is configured to detect the rotational direction and the rotational amount of the rotatable operation member 10.

The rotatable operation member 10 is provided with a rotatable knob 16, a click generating section 18, and a plurality of switch driving sections 20. The rotatable operation member 10 is supported by a panel 22 as shown in FIG. 1 or by a circuit board 24 behind the panel 22 such that the entire rotatable operation member 10 can be rotated.

The rotatable knob 16 in substantially in the shape of a cylinder, is disposed so as to protrude from the rear side of the panel 22 (the right side in FIG. 1) to the front side (the left side in FIG. 1), and is configured to be rotated while being held with fingers for example from the front side. Specifically, taking the central axis of the rotatable knob 16 as an operation central axis X (FIGS. 2 and 3), the rotatable knob 16 can be rotated in a first rotational direction indicated by the arrow A1 in FIGS. 1B, 2, and 3 and in its opposite direction, i.e., a second rotational direction indicated by the arrow A2 in FIGS. 1B, 2, and 3.

The click generating section 18 is disposed behind the rotatable knob 16, and generates in cooperation with the click mechanism 12 a click feel as the rotatable knob 16 is being rotated. Specifically, in the disclosed embodiment, the click generating section 18 is configured with an outer circumferential face provided with smoothly linked concave and convex portions in which a convex portion 18*a* and a concave portion 18*b* are repeated in a circumferential direction of rotation, which is a direction corresponding to the rotational directions of the rotatable operation member 10, and a back face (a face on which the switch driving sections 20 described below are arranged) 18*c* that is a flat face orthogonal to the operation central axis X. Meanwhile, in the disclosed embodiment, the click mechanism 12 is provided with a contact ball 26 that is in contact with the outer circumferential face of the click generating section 18 and a body section 28 that holds and presses the contact ball 26 against the outer circumferential face, and, when the contact ball 26 moves back and forth in the radial directions of the rotatable operation member 10 along the concave and convex portions of the click generating section 18, a click feel is given to the user, that is, the person who is holding the rotatable knob 16.

The switch driving sections 20 are respectively arranged at a plurality of positions that are intermittently arranged in the circumferential direction of rotation of the rotatable operation member 10, and protrude rearward (in a direction parallel to the operation central axis X) from the back face 18*c* of the click generating section 18. The switch driving sections 20 drive the rotation detection switch 14 such that, as the rotatable operation member 10 is being rotated, the rotation detection switch 14 intermittently outputs a rotation detection signal corresponding to the rotational direction. Their specific shape will be described later.

The switch driving sections 20 may protrude forward. For example, the outer diameter of the click generating section 18 may be set larger than the outer diameter of the rotatable knob 16, and the switch driving sections 20 may protrude from a portion of the front face of the click generating section 18 protruding outward in the radial directions beyond the rotatable knob 16. Alternatively, even in the case where the click generating section 18 and the click mechanism 12 are omitted, it is sufficient that the switch driving sections 20 are arranged at appropriate locations on the rotatable operation member 10.

The rotation detection switch 14 in the disclosed embodiment is disposed behind (on the rear side of) the rotatable operation member 10, is mounted on the circuit board 24 behind the panel 22, and includes a detector 30 and a switch body 32.

The detector 30 is driven through sequential contact with the switch driving sections 20 when the rotatable operation member 10 is being rotated. The detector 30 according to this embodiment has a tip end and a base end, and is shaped such that the cross-sectional area becomes smaller from the base end toward the tip end.

The switch body 32 can be provided with a box-like casing. This casing is fixed to the circuit board 24, and holds the detector 30 in a swingable manner. Specifically, the base end of the detector 30 is held such that the detector 30 moves in both a first downward direction and a second downward direction that are mutually opposite (that is, is swung) about an origin position at which the detector 30 is in an upright posture. Furthermore, this casing accommodates a spring mechanism (not shown) that is for biasing the detector 30 toward the origin position and a signal generating section that generates a detection signal. The signal generating section outputs a first detection signal each time the detector 30 moves downward in the first downward direction by at least a predetermined amount, and outputs a second detection signal, which is different from the first detection signal, each time the detector 30 moves downward in the second downward direction, which is opposite the first downward direction, by at least the predetermined amount. These detection signals are input to the circuit board 24 as detection signals of the rotational direction and the rotational amount of the rotatable operation member.

Figure 15:
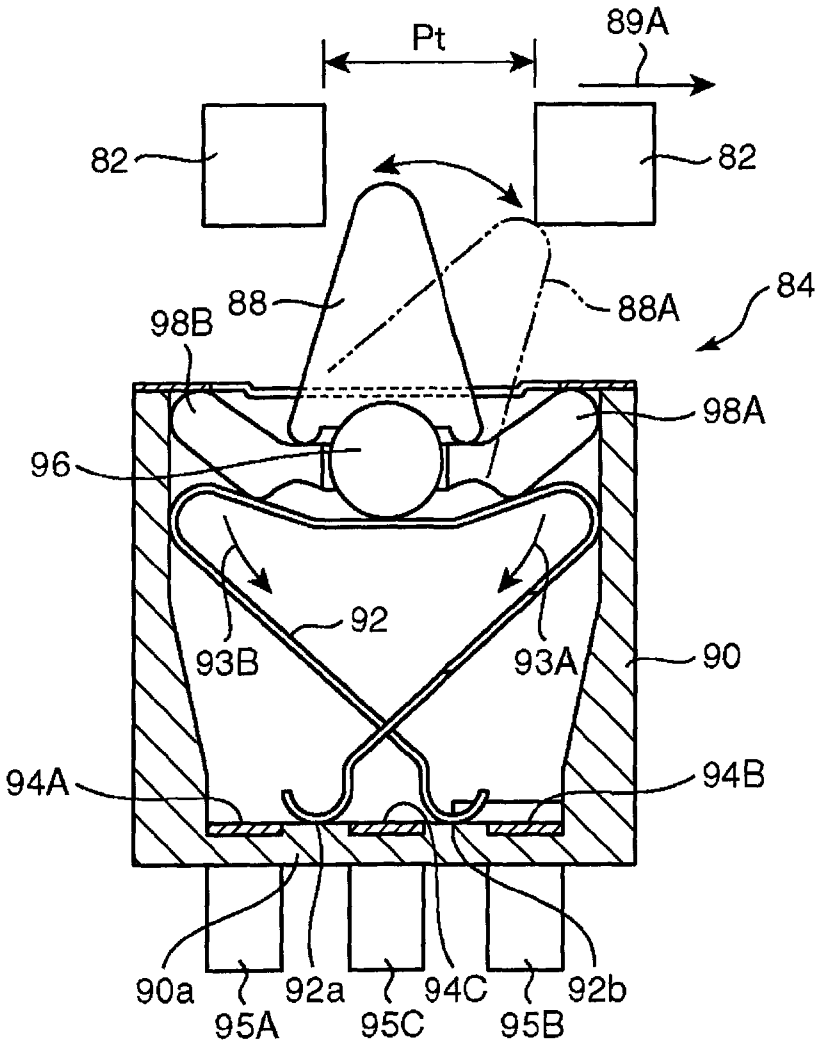
FIG. 15 is a cross-sectional view showing an example of the structure of a rotation detection switch.

As the rotation detection switch 14, for example, a well-known bidirectional switch as shown in FIG. 15 may be used as it is. That is to say, the rotation detection switch according to present disclosure may be any switch including a detector that can move to both sides from a predetermined origin position and a switch body that holds the detector in such a manner that the movement of the detector is allowed, wherein the switch body outputs a detection signal corresponding to a rotational direction and a rotational amount of the detector.

Furthermore, the movement of the detector 30 of the rotation detection switch 14 is not limited to the above-described upward and downward movement (swing movement). For example, the movement may be parallel movement (e.g., linear movement) from the origin position in a first movement direction on one side and in a second movement direction on the other side.

The arrangement position and the arrangement posture of the rotation detection switch 14 are set so as to satisfy the following conditions: a. the switch driving sections 20 are sequentially brought into contact with the detector 30 as the rotatable operation member is being rotated; and b. the first downward direction and the second downward direction of the detector 30 match the radial directions of rotation of the rotatable operation member 10, that is, directions orthogonal to the circumferential direction of rotation and along the radius of rotation of the rotatable operation member 10. In this embodiment, the directions are set such that the first downward direction matches a direction that is along a radial direction of rotation toward the outer side, and the second downward direction matches a direction that is along a radial direction of rotation toward the inner side.

Meanwhile, the shape of the switch driving sections 20 is set so as to satisfy the following conditions.

a. When brought into contact with the detector 30 as the rotatable operation member 10 is being rotated in the first rotational direction (the arrow A1 direction), a switch driving section 20 moves the detector 30 downward in the first downward direction by at least the predetermined amount. Subsequently, the switch driving section 20 moves away from and releases the detector 30.

b. When brought into contact with the detector 30 as the rotatable operation member 10 is being rotated in the second rotational direction (the arrow A2 direction), a switch driving section 20 moves the detector 30 downward in the second downward direction by at least the predetermined amount. Subsequently, the switch driving section 20 moves away from and releases the detector 30.

Figure 4B:
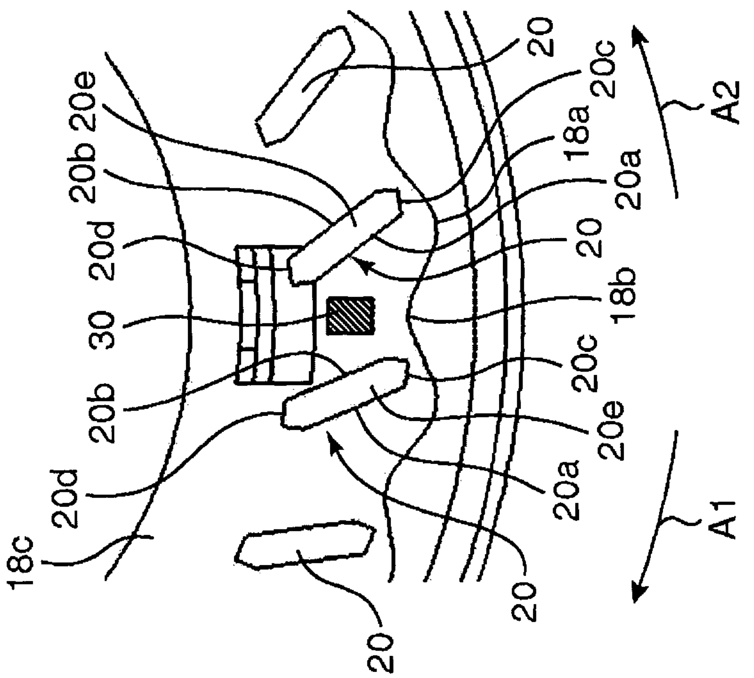
FIG. 4B is a cross-sectional view taken along the line 4B-4B in FIG. 4A.

Specifically, the switch driving sections 20 according to this embodiment are each in the shape of a blade that extends in a direction inclined with respect to both the circumferential direction of rotation and the radial direction of rotation of the rotatable operation member 10. As shown in FIG. 4B, the two side faces in the width direction of the switch driving section 20 form a first guide face 20*a* and a second guide face 20*b* in the shape of mutually parallel plates, one end portion in the longitudinal direction forms an outer end face 20*c* positioned on the outer side in the radial direction of rotation of the rotatable operation member 10, and the other end portion forms an inner end face 20*d* positioned on the inner side in the radial direction of rotation.

Figure 5B:
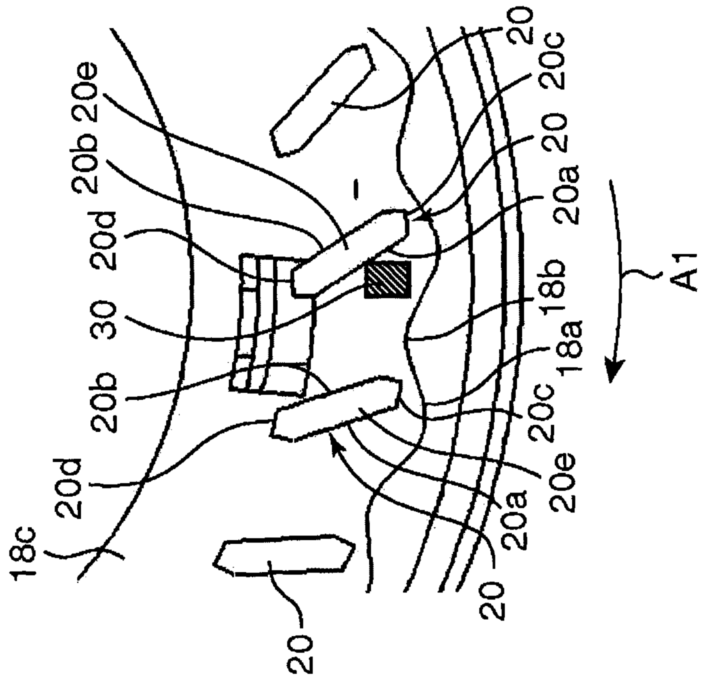
FIG. 5B is a cross-sectional view taken along the line 5B-5B in FIG. 5A.
Figure 5A:
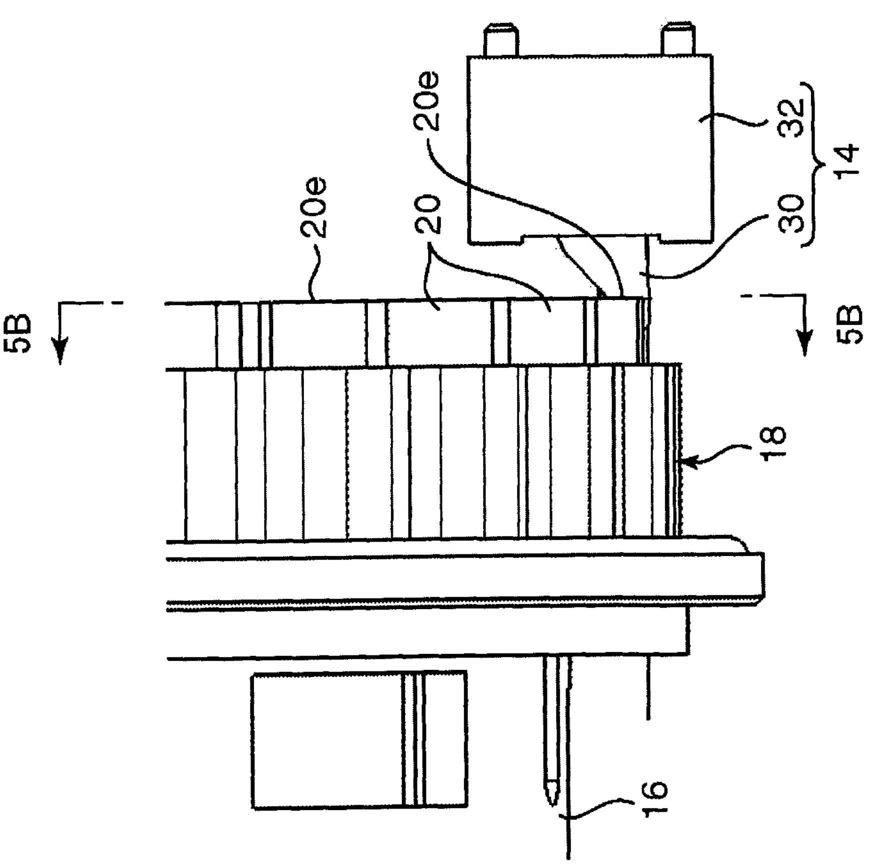
FIG. 5A is a side view showing a state where a switch driving section of a rotatable operation member has been brought into contact with the detector of the rotation detection switch and the detector starts to move downward from the origin position in a first downward direction.
Figure 6B:
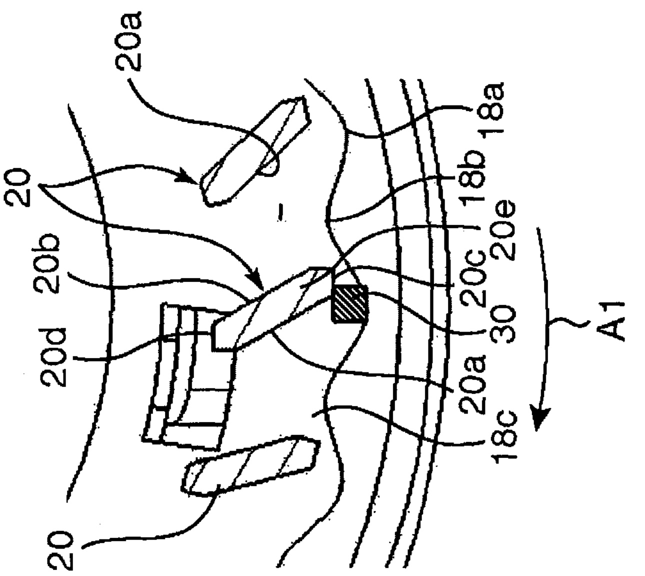
FIG. 6B is a cross-sectional view taken along the line 6B-6B in FIG. 6A.
Figure 6A:
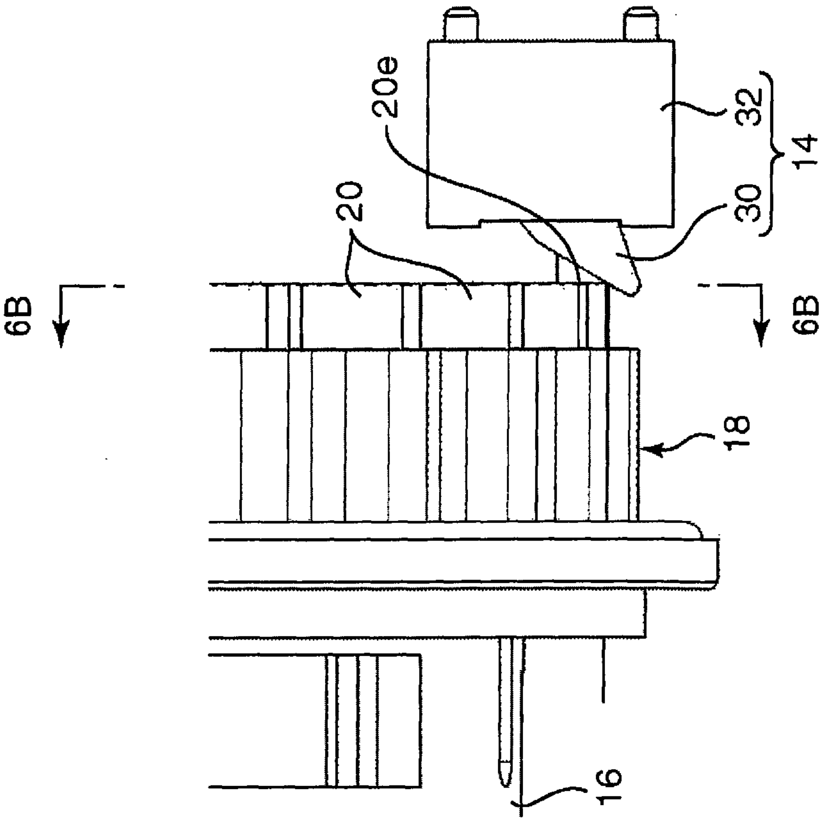
FIG. 6A is a side view showing a state where the detector of the rotation detection switch starts to surmount the switch driving section.
Figure 7B:
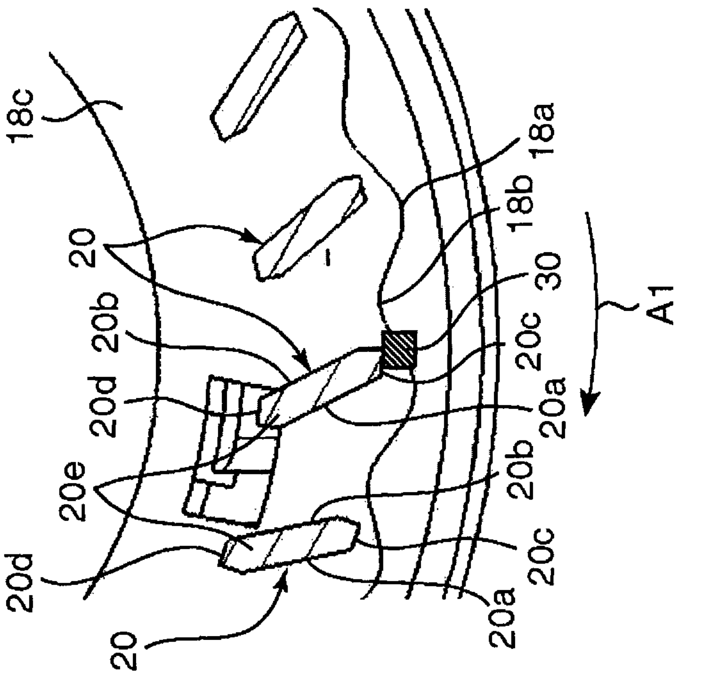
FIG. 7B is a cross-sectional view taken along the line 7B-7B in FIG. 7A.
Figure 7A:
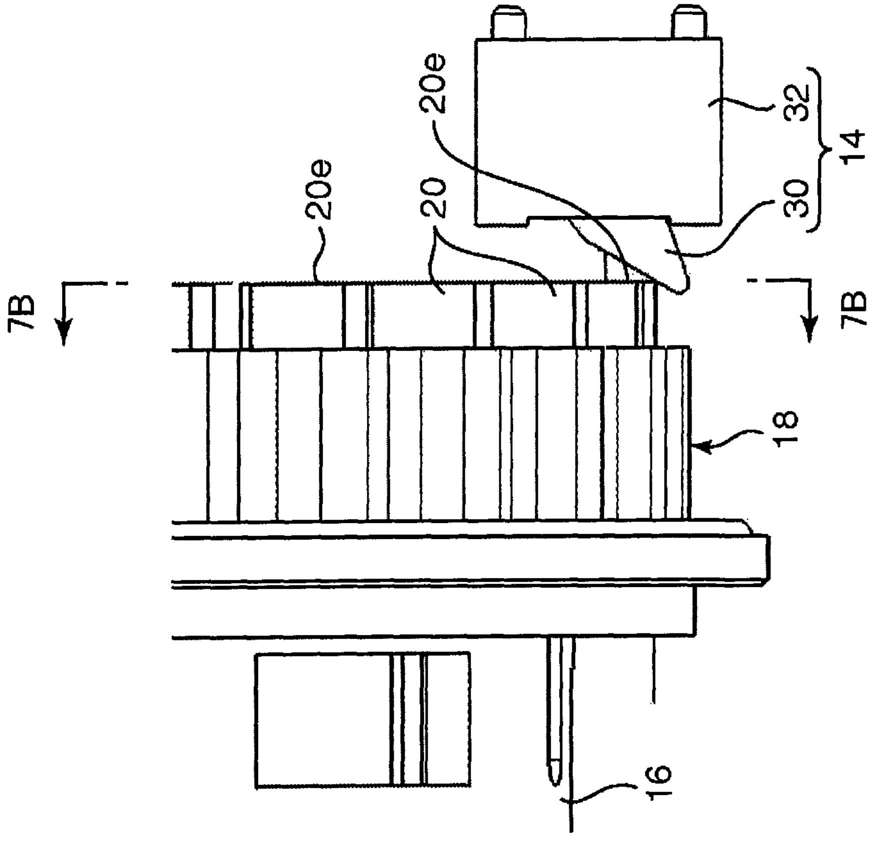
FIG. 7A is a side view showing a state where the detector of the rotation detection switch is about to completely surmount the switch driving section.

The first guide face 20*a* is a face that is brought into contact with the detector 30 when the rotatable operation member 10 is rotated in the first rotational direction. The angle of inclination of the first guide face 20*a* is set such that, as the rotation progresses, the first guide face 20*a* slides along the detector 30 and guides the detector 30 in the first downward direction (the outer side in the radial direction of rotation of the rotatable operation member 10) (FIGS. 5A and 5B). Furthermore, the position of the outer end face 20*c* is set such that, after the detector 30 moves downward in the first downward direction by at least the predetermined amount, the detector 30 climbs the outer end face 20*c* (FIGS. 6A and 6B), and, as the rotation further progresses, surmounts the outer end face 20*c* and is released (moved away) from the switch driving section 20.

The second guide face 20*b* is a face that is brought into contact with the detector 30 when the rotatable operation member 10 is rotated in the second rotational direction. The angle of inclination of the second guide face 20*b* is set such that, as the rotation progresses, the second guide face 20*b* slides along the detector 30 and guides the detector 30 in the second downward direction (the inner side in the radial direction of rotation of the rotatable operation member 10). Furthermore, the position of the inner end face 20*d* is set such that, after the detector 30 moves downward in the second downward direction by at least the predetermined amount, the detector 30 climbs the inner end face 20*d*, and, as the rotation further progresses, surmounts the inner end face 20*d* and is released (moved away) from the switch driving section 20.

The shape of the switch driving sections 20 is not limited to the above-described shape that allows the detector 30 to climb the outer end face 20*c* and the inner end face 20*d*. For example, the protrusion amount of the switch driving section 20 may be set such that, as the detector 30 moves downward, the detector 30 climbs a rear end face 20*e* of the switch driving section 20.

Next, the operation of an exemplary rotation detection device will be described.

Figure 4A:
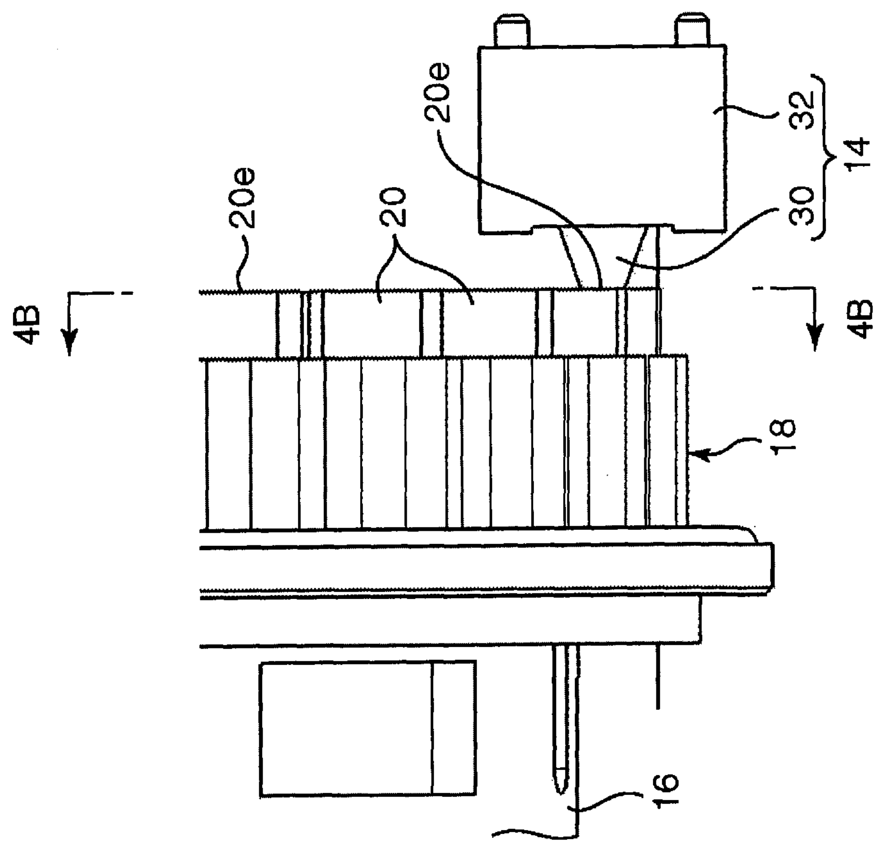
FIG. 4A is a side view showing a state where the detector of the rotation detection switch is at the origin position.

In a state where the detector 30 of the rotation detection switch 14 is positioned between given two switch driving sections 20, more specifically, is positioned between the first guide face 20*a* of a given switch driving section 20 and the second guide face 20*b* of its adjacent switch driving section 20 and is not in contact with either the face 20*a* or the face 20*b* as shown in FIG. 4B, the detector 30 is held at the origin position in the upright posture as shown in FIG. 4A. In this state, the rotation detection switch 14 outputs no detection signal.

In this state, if the rotatable operation member 10 is rotated in the first rotational direction indicated by the arrow A1 in FIGS. 2 to 4, the first guide face 20*a* of the switch driving section 20 that is adjacent on the upstream side in the rotational direction (the right side in FIG. 4B) to the detector 30 is brought into contact with the detector 30, and guides the detector 30 to the outer side in the radial direction of rotation of the rotatable operation member 10. Specifically, while sliding along the detector 30, the first guide face 20*a* moves the detector 30 downward in the first downward direction (FIGS. 5A and 5B).

When the rotation progresses and the amount by which the detector 30 moves downward in the first downward direction reaches the predetermined amount, the switch body 32 of the rotation detection switch 14 outputs a first detection signal. After further moving downward, the detector 30 climbs the outer end face 20*c* of the switch driving section 20 (FIGS. 6A, 6B, 7A, and 7B), and, finally, surmounts the outer end face 20*c* and is released from the switch driving section 20. Accordingly, the detector 30 returns to the original origin position, and returns the first detection signal from on to off. Furthermore, the detector 30 starts to be in contact with the first guide face 20*a* of the next switch driving section 20, and repeats the above-described movement. Accordingly, the first detection signal of the rotation detection switch 14 is repeatedly turned on and off.

On the other hand, if the rotatable operation member 10 is rotated in the second rotational direction indicated by the arrow A2 in FIGS. 2 to 4, this time, the second guide face 20*b* of the switch driving section 20 that is adjacent to the detector 30 on the side opposite the previous side is brought into contact with the detector 30, and the detector 30 is guided to the inner side in the radial direction of rotation of the rotatable operation member 10 while sliding along the second guide face 20*b*. That is to say, the detector 30 starts to move downward in the second downward direction. Then, when the amount of the downward movement reaches the predetermined amount, the rotation detection switch 14 outputs a second detection signal, which is different from the first detection signal. After further moving downward, the detector 30 climbs the inner end face 20*d* of the switch driving section 20. Subsequently, the detector 30 surmounts the inner end face 20*d*, and is thus released from the switch driving section 20. Thus, the detector 30 returns to the original origin position, and turns the second detection signal off. Accordingly, the second detection signal is repeatedly turned on and off.

According to a feature of this rotatable operation device, the rotation detection switch 14 is disposed in a posture in which the movement directions of the detector 30 of the rotation detection switch 14 (the first downward direction and the second downward direction in this embodiment) match the radial directions of rotation of the rotatable operation member 10 orthogonal to the circumferential direction of rotation, and the shape of the switch driving sections 20 is set such that the detector 30 is moved downward in the above-described directions. Accordingly, it is possible to ensure a sufficient movement stroke of the detector 30 while realizing a small interval between the switch driving sections 20 arranged in the circumferential direction of rotation, that is, a small rotation detection pitch.

For example, in a conventional rotation detection device as shown in FIG. 15, the movement directions (swing directions) of the detector 88 of the rotation detection switch 84 match the circumferential directions of rotation of the rotatable operation member, and, thus, in order to ensure a movement stroke of the detector 88, it is unavoidable to set a large interval between the switch driving sections 82 (the arrangement pitch Pt). On the other hand, in the device shown in FIGS. 1 to 7, the rotation detection switch 14 is disposed in a posture in which the movement directions (upward and downward directions, i.e., swing directions) of the detector 30 match the radial directions of rotation of the rotatable operation member 10, or rather is orthogonal to the circumferential direction of rotation, and, thus, the required movement distance of the detector 30 in the circumferential direction of rotation becomes substantially 0. Similar configuration can be achieved for other types of detectors. For example, a linearly moving switch and accompanying detector need only be configured such that the movement direction of the detector be oblique, and more preferably, orthogonal to the linear movement of the device whose movement is being detected. Accordingly, the limitation to the reduction in the arrangement pitch of the switch driving sections 20, that is, the rotation detection pitch in the circumferential direction of rotation, the limitation being caused by the required movement distance of the detector 30, is eliminated, and the pitch can be significantly reduced.

Furthermore, in the case where the click mechanism 12 and the click generating section 18 as shown in the drawings are provided and they generate a click feel at the same pitch as the rotation detection pitch, it is also possible to improve a sense of operation given to the user by reducing the click feel generation pitch according to the reduction in the rotation detection pitch.

Next, a second embodiment of the present disclosure will be described with reference to FIGS. 8 to 13. Note that the configuration of the device according to the second embodiment is the same as that of the device according to the first embodiment, except for the specific shape and arrangement of the switch driving sections and the specific arrangement of the rotation detection switch, and, thus, the corresponding constituent elements are denoted by the same reference numerals, and their further description has been omitted. Hereinafter, mainly differences between the devices according to these embodiments will be described.

The differences in the configuration of the device according to the second embodiment are as follows.

A. Regarding the Arrangement of the Switch Driving Sections

In the device according to the second embodiment, a portion having a cylindrical outer circumferential face (arrangement face) 34 centered about the operation central axis X is disposed at the rear end of the click generating section 18 in the rotatable operation member 10, and a plurality of switch driving sections 36 are arranged on the outer circumferential face 34. The switch driving sections 36 are intermittently arranged in the circumferential direction of rotation of the rotatable operation member 10, and protrude outward in the radial directions of rotation from the outer circumferential face 34.

The switch driving sections 36 also may protrude inward in the radial directions. For example, the click generating section 18 may be in the shape of a hollow cylinder, and the switch driving sections 36 may protrude inward from the inner circumferential face of the click generating section 18. Furthermore, even in the case where the click generating section 18 and the click mechanism 12 are omitted, it is sufficient that the switch driving sections 36 are arranged at appropriate locations on the rotatable operation member 10.

B. Regarding the Arrangement of the Rotation Detection Switch 14

In this particular embodiment, the rotation detection switch 14 is disposed not behind (on the rear side of) the rotatable operation member 10 but at a position on the outer side in the radial direction such that the switch driving sections 36 are sequentially brought into contact with the detector 30 as the rotatable operation member 10 is being rotated. The posture of the rotation detection switch 14 is set such that the movement directions of the detector 30 (the first downward direction and the second downward direction) match directions parallel to the operation central axis X of the rotatable operation member 10, that is, the front and rear directions. More specifically, in this embodiment, the first downward direction of the detector 30 is set so as to mach the rear direction (the direction toward the circuit board 24) of the directions (front and rear directions) parallel to the operation central axis X, and the second downward direction is set so as to mach the front direction (the direction toward the panel 22).

C. Regarding the Arrangement of the Switch Driving Sections

The shape of the switch driving sections 36 is set so as to satisfy the following conditions.

a. When brought into contact with the detector 30 as the rotatable operation member 10 is being rotated in the first rotational direction (the arrow A1 direction), a switch driving section 36 moves the detector 30 downward in the first downward direction by at least the predetermined amount. Subsequently, the switch driving section 36 moves away from and releases the detector 30.

b. When brought into contact with the detector 30 as the rotatable operation member 10 is being rotated in the second rotational direction (the arrow A2 direction), a switch driving section 36 moves the detector 30 downward in the second downward direction by at least the predetermined amount. Subsequently, the switch driving section 36 moves away from and releases the detector 30.

Specifically, the switch driving sections 36 according to this embodiment are each in the shape of a blade that extends in a direction inclined with respect to both the circumferential direction of rotation of the rotatable operation member 10 and the direction parallel to the operation central axis X. As shown in FIG. 10B, the two side faces in the width direction of the switch driving section 36 form a first guide face 36*a* and a second guide face 36*b* in the shape of mutually parallel plates, one end portion in the longitudinal direction forms a rear end face 36*c* positioned on the rear side in the direction (front-and-rear direction) parallel to the operation central axis X, and the other end portion forms a front end face 36*d* positioned on the inner side in the radial direction of rotation.

The first guide face 36*a* is a face that is brought into contact with the detector 30 when the rotatable operation member 10 is rotated in the first rotational direction. The angle of inclination of the first guide face 36*a* is set such that, as the rotation progresses, the first guide face 36*a* slides along the detector 30 and guides the detector 30 in the first downward direction (the rear direction of the rotatable operation member 10) (FIGS. 11A and 11B) Furthermore, the position of the rear end face 36*c* of the switch driving section 36 is set such that, after the detector 30 moves downward in the first downward direction by at least the predetermined amount, the detector 30 climbs the rear end face 36*c* (FIGS. 12A and 12B), and, as the rotation further progresses, surmounts the rear end face 36*c* and is released (moved away) from the switch driving section 36.

The second guide face 36*b* is a face that is brought into contact with the detector 30 when the rotatable operation member 10 is rotated in the second rotational direction. The angle of inclination of the second guide face 36*b* is set such that, as the rotation progresses, the second guide face 36*b* slides along the detector 30 and guides the detector 30 in the second downward direction (the front direction of the rotatable operation member 10). Furthermore, the position of the front end face 36*d* of the switch driving section 36 is set such that, after the detector 30 moves downward in the second downward direction by at least the predetermined amount, the detector 30 climbs the front end face 36*d*, and, as the rotation further progresses, surmounts the front end face 36*d* and is released (moved away) from the switch driving section 36.

The shape of the switch driving sections 36 according to this embodiment is not limited to the above-described shape that allows the detector 30 to climb the rear end face 36*c* and the front end face 36*d*. For example, the protrusion amount of the switch driving section 36 may be set such that, as the detector 30 moves downward, the detector 30 climbs an outer end face 36*e* of the switch driving section 36.

Next, the operation of this rotation detection device will be described.

Figure 10A:
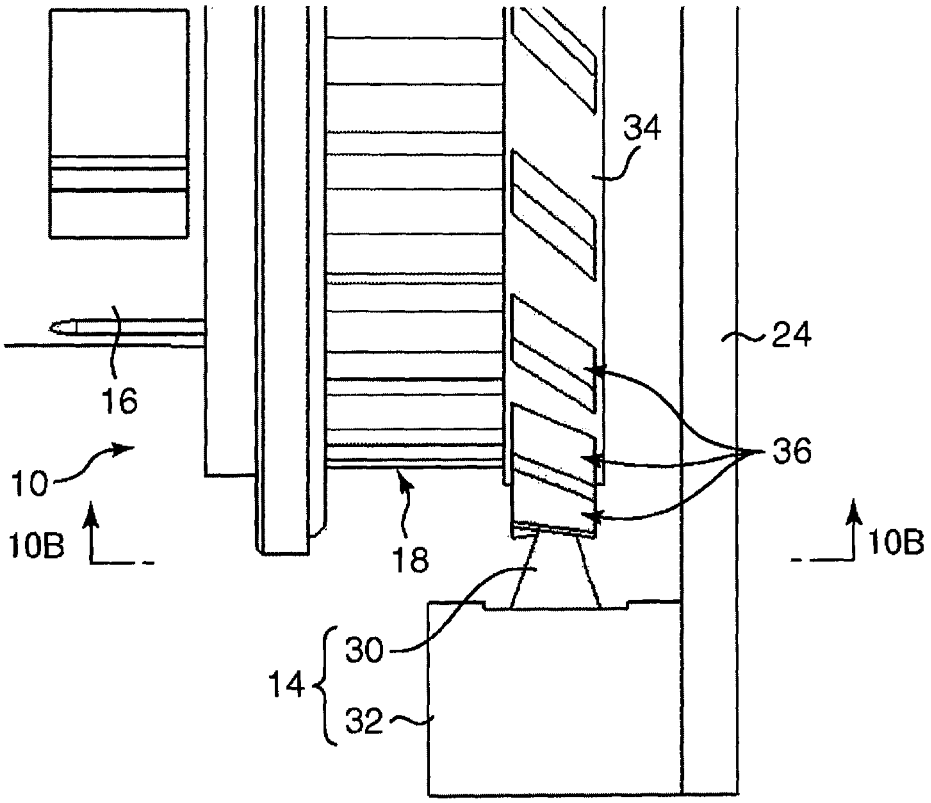
FIG. 10A is a side view showing a state where the detector of the rotation detection switch is at its origin position in the rotation detection device shown in FIG. 8.
Figure 10B:
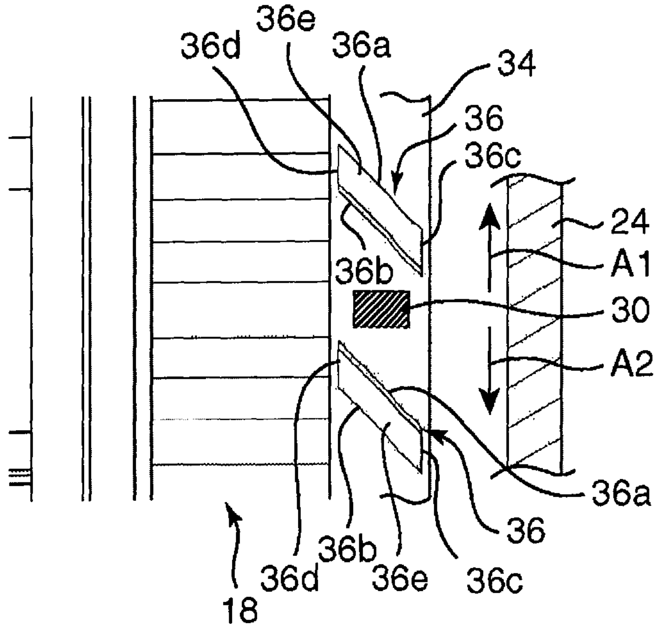
FIG. 10B is a cross-sectional view taken along the line 10B-10B in FIG. 10A.

First, in a state where the detector 30 of the rotation detection switch 14 is positioned between given two switch driving sections 36, more specifically, is positioned between the first guide face 36*a* of a given switch driving section 36 and the second guide face 36*b* of its adjacent switch driving section 36 and is not in contact with either the face 36*a* or the face 36*b* as shown in FIG. 10B, the detector 30 is held at the origin position in the upright posture as shown in FIG. 10A. In this state, the rotation detection switch 14 outputs no detection signal.

Figure 8:
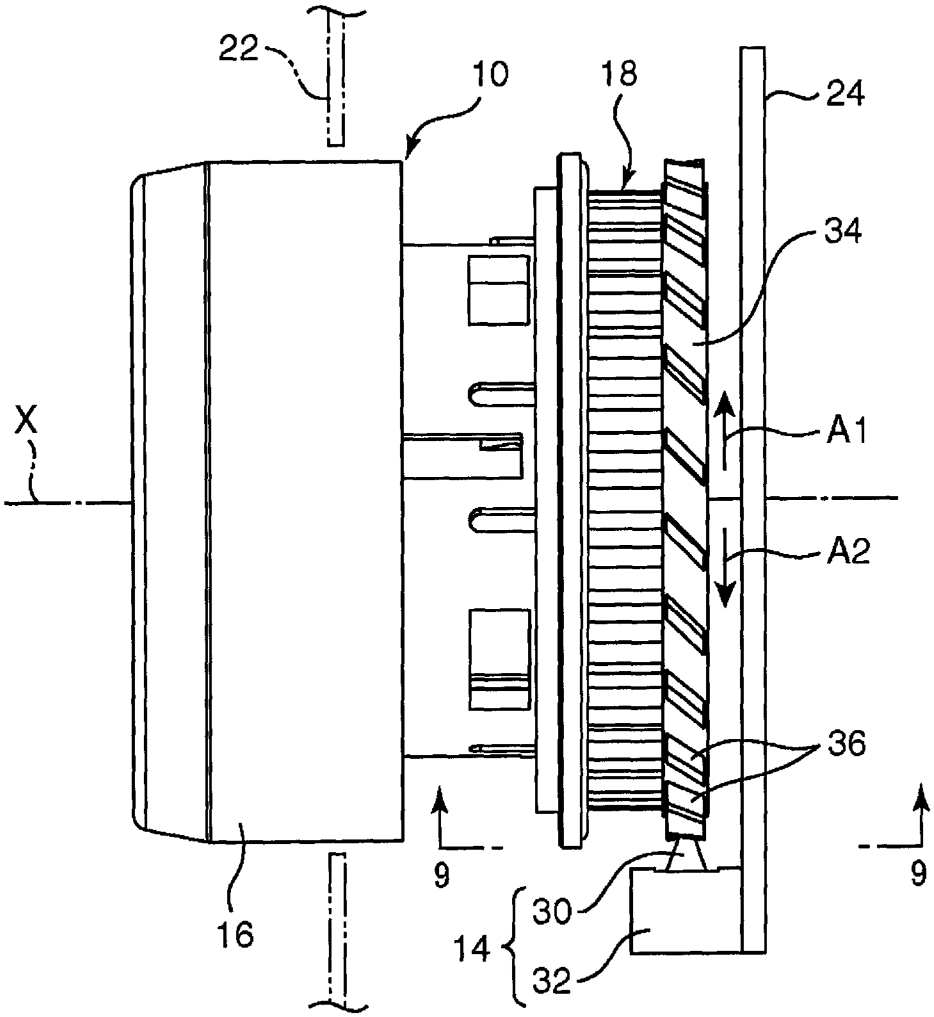
FIG. 8 is a side view of a rotation detection device according to a second embodiment of the present disclosure.
Figure 9:
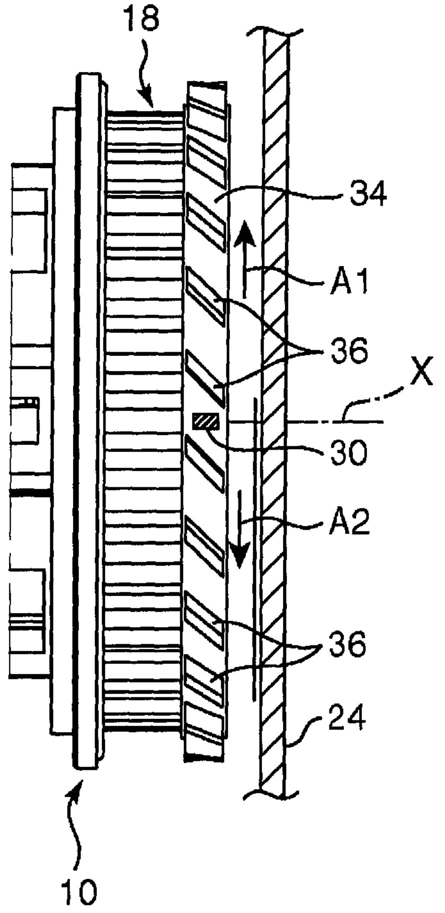
FIG. 9 is a cross-sectional view taken along the line 9-9 in FIG. 8.
Figure 11A:
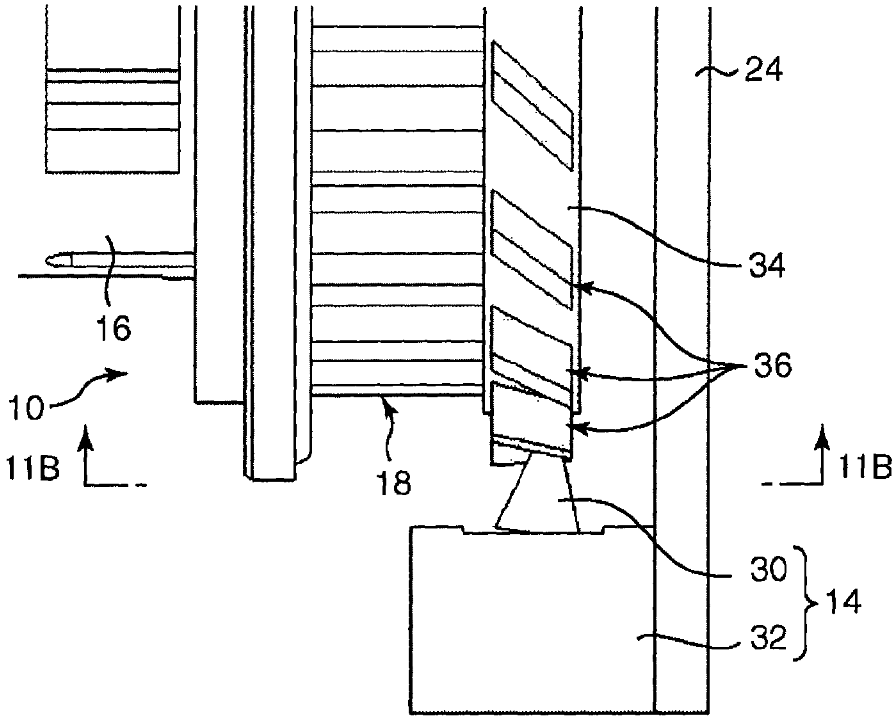
FIG. 11A is a side view showing a state where a switch driving section of a rotatable operation member has been brought into contact with the detector of the rotation detection switch and the detector starts to move downward from the origin position in a first downward direction in the rotation detection device shown in FIG. 8.
Figure 11B:
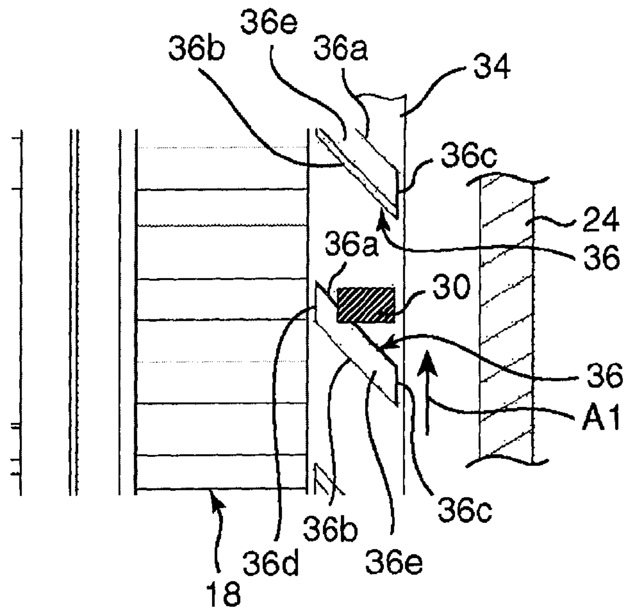
FIG. 11B is a cross-sectional view taken along the line 11B-11B in FIG. 11A.
Figure 12A:
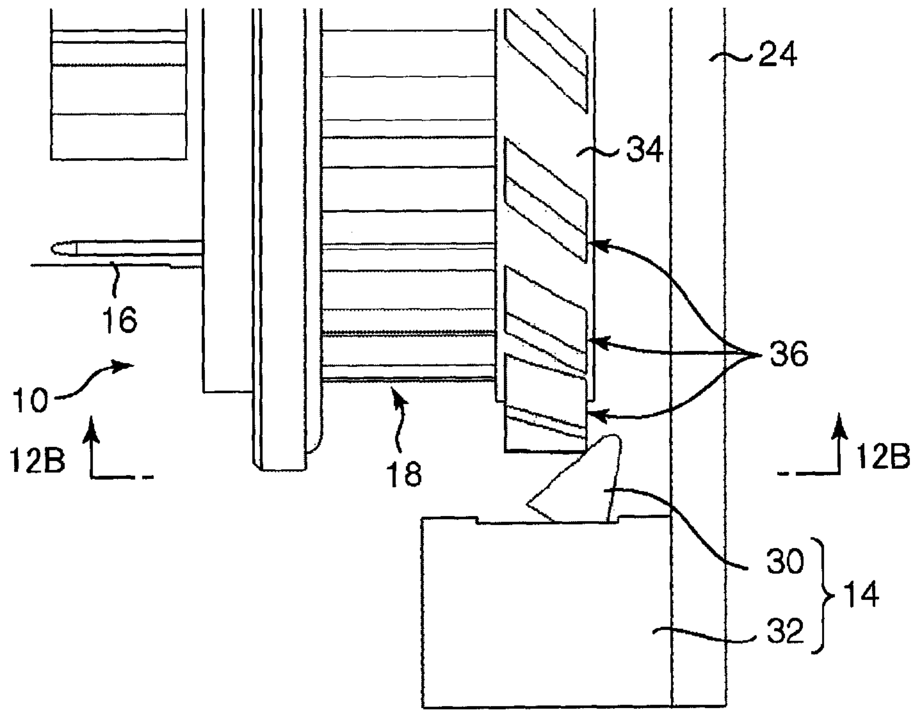
FIG. 12A is a side view showing a state where the detector of the rotation detection switch starts to surmount the switch driving section in the rotation detection device shown in FIG. 8.
Figure 12B:
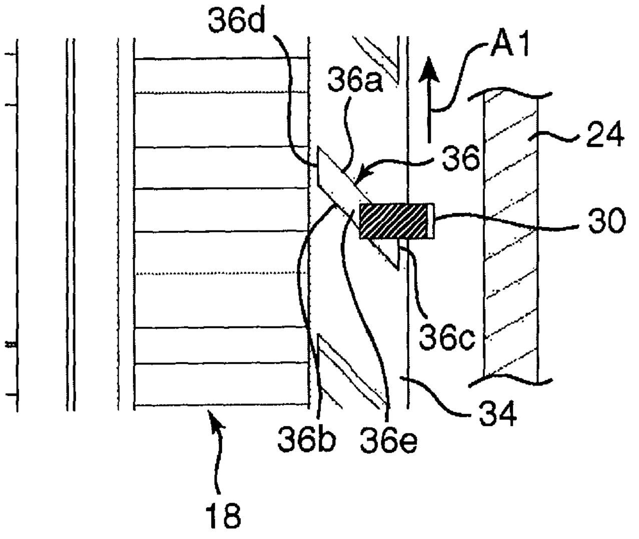
FIG. 12B is a cross-sectional view taken along the line 12B-12B in FIG. 12A.
Figure 13A:
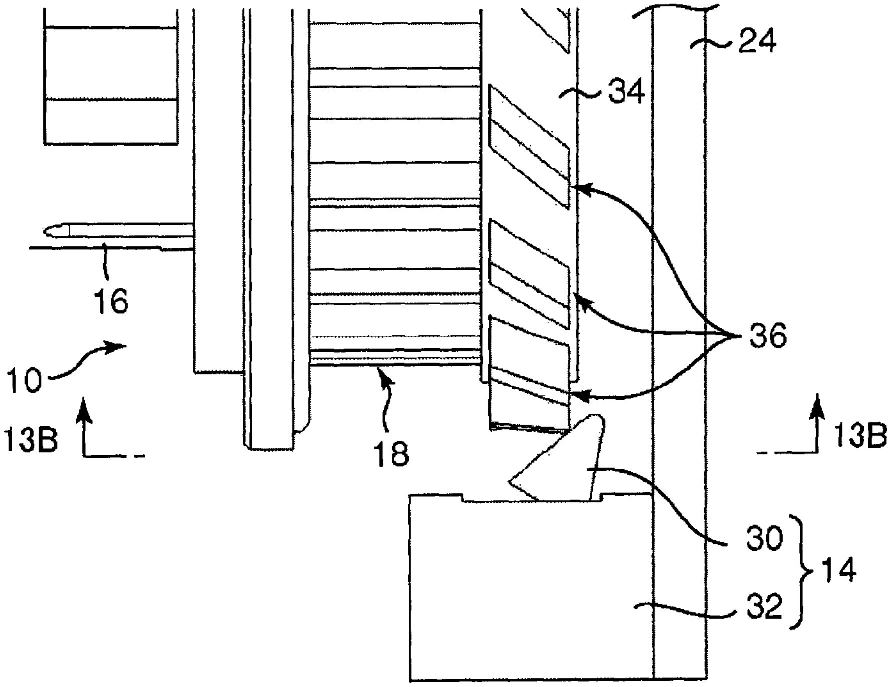
FIG. 13A is a side view showing a state where the detector of the rotation detection switch is about to completely surmount the switch driving section in the rotation detection device shown in FIG. 8.
Figure 13B:
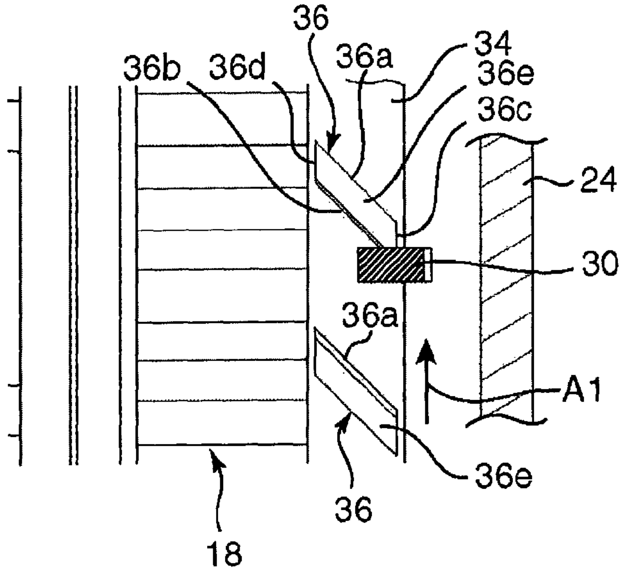
FIG. 13B is a cross-sectional view taken along the line 13B-13B in FIG. 13A.
Figure 14:
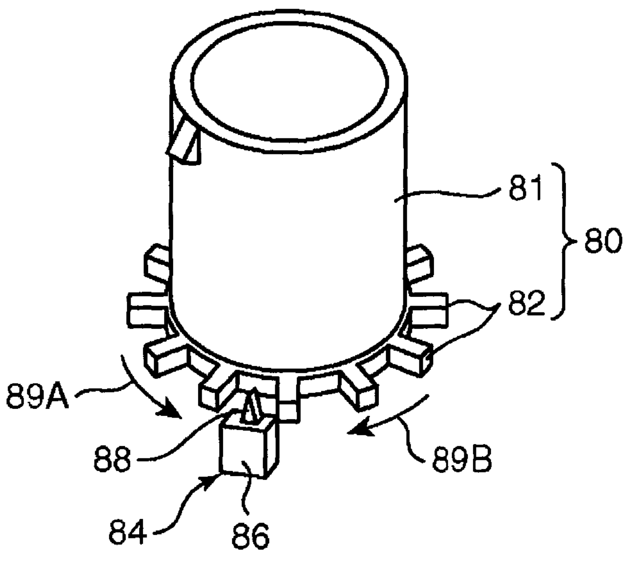
FIG. 14 is a perspective view showing an example of a conventional rotatable operation device.

In this state, if the rotatable operation member 10 is rotated in the first rotational direction indicated by the arrow A1 in FIGS. 8 to 10, the first guide face 36*a* of the switch driving section 36 that is adjacent on the upstream side in the rotational direction (the lower side in FIG. 10B) to the detector 30 is brought into contact with the detector 30, and guides the detector 30 to the rear side of the rotatable operation member 10. Specifically, while sliding along the detector 30, the first guide face 36*a* moves the detector 30 downward in the first downward direction (FIGS. 11A and 11B).

When the rotation progresses and the amount by which the detector 30 moves downward in the first downward direction reaches the predetermined amount, the switch body 32 of the rotation detection switch 14 outputs a first detection signal. After further moving downward, the detector 30 climbs the rear end face 36*c* of the switch driving section 36 (FIGS. 12A, 12B, 13A, and 13B), and, finally, surmounts the rear end face 36*c* and is released from the switch driving section 36. Accordingly, the detector 30 returns to the original origin position, and returns the first detection signal from on to off. Furthermore, the detector 30 starts to be in contact with the first guide face 36*a* of the next switch driving section 36, and repeats the above-described movement. Accordingly, the first detection signal of the rotation detection switch 14 is repeatedly turned on and off.

On the other hand, if the rotatable operation member 10 is rotated in the second rotational direction indicated by the arrow A2 in FIGS. 8 to 10, the second guide face 36*b* of the switch driving section 36 is brought into contact with the detector 30, and the detector 30 is guided to the front side of the rotatable operation member 10 while sliding along the second guide face 36*b* and starts to move downward in the second downward direction. Then, when the amount of the downward movement reaches the predetermined amount, the rotation detection switch 14 outputs a second detection signal, which is different from the first detection signal. After further moving downward, the detector 30 climbs the front end face 36*d* of the switch driving section 36. Subsequently, the detector 30 surmounts the front end face 36*d*, and is thus released from the switch driving section 36. Thus, the detector 30 returns to the original origin position, and turns the second detection signal off. Accordingly, the second detection signal is repeatedly turned on and off.

Also in the rotation detection device according to the second embodiment, the rotation detection switch 14 is disposed in a posture in which the movement directions of the detector 30 of the rotation detection switch 14 (the first downward direction and the second downward direction in this embodiment) match the front and rear directions (the directions parallel to the operation central axis X) orthogonal to the circumferential direction of rotation of the rotatable operation member 10, and the shape of the switch driving sections 36 is set such that the detector 30 is moved downward in the above-described directions. Accordingly, it is possible to ensure a sufficient movement stroke of the detector 30 while realizing a small interval between the switch driving sections 36 arranged in the circumferential direction of rotation, that is, a small rotation detection pitch.

Note that, in the present disclosure, the movement directions of the detector (downward directions in the foregoing embodiments) do not necessarily have to match directions (the radial directions of rotation in the first embodiment and the directions parallel to the operation central axis X in the second embodiment) orthogonal to the circumferential direction of rotation of the rotatable operation member, and may be any direction as long as they are oblique, and more preferably closer to a direction orthogonal to the movement direction, i.e., orthogonal to the circumferential direction of rotation than to the circumferential direction of rotation. If the movement directions of the detector are set in this manner, the limitation to the reduction in the arrangement pitch of the switch driving sections, that is, the rotation detection pitch can be alleviated compared with that in a conventional rotation detection device (i.e., device in which the movement directions of a rotation detection switch match the circumferential directions of rotation), and the degree of freedom in reducing the pitch can be accordingly increased.

As described above, the present disclosure provides a rotatable operation device, including a rotatable operation member and a rotation detection switch that detects rotation of the rotatable operation member, wherein the rotation detection pitch can be reduced while a proper operation of the rotation detection switch is ensured.

Specifically, the rotation detection device provided by the present disclosure includes a rotatable operation member that can be rotated in both a first rotational direction and a second rotational direction, which is opposite the first rotational direction, about a given operation central axis, and a rotation detection switch that detects a rotational direction and a rotational amount of the rotatable operation member. The rotatable operation member includes a plurality of switch driving sections that are intermittently arranged in a circumferential direction of the rotatable operation member. The rotation detection switch is provided with a detector and a switch body. The switch body holds the detector such that the detector can move in both a first movement direction and a second movement direction, which are opposite each other, from an origin position at which the detector is in an upright posture, biases the detector toward the origin position, and, each time the detector moves in the first movement direction or the second movement direction by a predetermined amount, outputs a detection signal corresponding to the movement direction. The rotation detection switch is disposed in a posture in which the first movement direction and the second movement direction of the detector are closer to a direction (a radial direction of rotation of the rotatable operation member, or a direction parallel to the operation central axis) orthogonal to the circumferential direction of rotation of the rotatable operation member than to the circumferential direction of rotation at a position where the switch driving sections of the rotatable operation member can be brought into contact with the detector. The switch driving sections of the rotatable operation member are each shaped such that, when brought into contact with the detector as the rotatable operation member is being rotated in the first rotational direction, the switch driving sections move the detector in the first movement direction by at least the predetermined amount and then release the detector, and such that, when brought into contact with the detector as the rotatable operation member is being rotated in the second rotational direction, the switch driving sections move the detector in the second movement direction by at least the predetermined amount and then release the detector.

In this rotatable operation device, since the rotation detection switch is disposed in a posture in which the movement directions of the detector (the first movement direction and the second movement direction) are closer to a direction (a radial direction of rotation of the rotatable operation member, or a direction parallel to the operation central axis) orthogonal to the circumferential direction of rotation of the rotatable operation member than to the circumferential direction of rotation, it is possible to ensure a sufficient movement stroke of the detector while realizing a small interval between the switch driving sections arranged in the circumferential direction of rotation, that is, a small rotation detection pitch. That is to say, in a conventional rotatable operation device, since the rotation detection switch is disposed such that the circumferential direction of rotation of the rotatable operation member and the arrangement direction of the switch driving sections (e.g., the driving protrusions 82 in the device shown in FIG. 15) match the movement directions of the detector of the rotation detection switch (the swing directions of the detector 88 in the device shown in FIG. 15), a large interval between the switch driving sections has to be ensured in order to ensure a movement stroke of the detector, but, in the device according to the present disclosure, since the posture of the rotation detection switch is determined such that the movement directions of the detector are closer to a direction orthogonal to the circumferential direction of rotation of the rotatable operation member than to the circumferential direction of rotation, the required movement distance of the detector in the circumferential direction of rotation is short, and the arrangement pitch of the switch driving sections, that is, the rotation detection pitch in the circumferential direction of rotation can be accordingly reduced.

In particular, if the rotation detection switch is disposed such that the movement directions of the detector match directions orthogonal to the circumferential direction of rotation of the rotatable operation member, the required movement distance of the detector in the circumferential direction of rotation of the rotatable operation member becomes substantially 0. Accordingly, the arrangement pitch of the switch driving sections in the circumferential direction of rotation can be significantly reduced.

The specific shape of each of the switch driving sections is preferably set so as to have: a first guide face that is inclined with respect to the circumferential direction of rotation of the rotatable operation member such that, when the rotatable operation member is rotated in the first rotational direction, the first guide face is brought into contact with the detector, and guides the detector in the first movement direction while sliding along the detector; and a second guide face that is inclined with respect to the circumferential direction of rotation of the rotatable operation member such that, when the rotatable operation member is rotated in the second rotational direction, the second guide face is brought into contact with the detector, and guides the detector in the second movement direction while sliding along the detector. Such switch driving sections have a simple shape, but can move the detector in directions corresponding to the rotational directions of the rotatable operation member.

It is sufficient that the movement directions of the detector of the rotation detection switch with respect to the rotatable operation member are set according to the state where the switch driving sections are arranged on the rotatable operation member. For example, the rotatable operation member may have an arrangement face orthogonal to an operation central axis of the rotatable operation member, and the switch driving sections may protrude in a direction parallel to the operation central axis from the arrangement face. In this case, it is sufficient that the rotation detection switch is disposed such that, when the switch driving sections are brought into contact with the detector, the detector moves in a direction closer to a radial direction of rotation of the rotatable operation member than to the circumferential direction of rotation.

Alternatively, the rotatable operation member may have a cylindrical arrangement face centered about an operation central axis of the rotatable operation member, and the switch driving sections may protrude in radial directions of rotation of the rotatable operation member from the arrangement face. In this case, it is sufficient that the rotation detection switch is disposed such that, when the switch driving sections are brought into contact with the detector, the detector moves in a direction closer to a direction parallel to the operation central axis than to the circumferential direction of rotation of the rotatable operation member.

The invention claimed is:

1. A rotation detection device, comprising:

a rotatable operation member configured to be rotated in a first rotational direction and a second rotational direction opposite the first rotational direction, about a given operation central axis; and a rotation detection switch configured to detect movement of the rotatable operation member in the first or second rotational direction and a rotational amount of movement of the rotatable operation member;

wherein the rotatable operation member includes a plurality of switch driving sections that are intermittently arranged in a circumferential direction of the rotatable operation member, the rotation detection switch includes a detector, and a switch body that is configured to hold the detector such that the detector can move in both a first movement direction and a second movement direction opposite the first movement direction, from an origin position, the detector is configured to be biased toward the origin position such that each time the detector moves in the first movement direction or the second movement direction from the origin position by a predetermined amount, the rotation detection switch outputs a detection signal corresponding to the first or second movement direction, the rotation detection switch is disposed in a posture in which the first movement direction and the second movement direction of the detector are in a direction oblique to the circumferential direction at a position where the switch driving sections of the rotatable operation member can be brought into contact with the detector, and the switch driving sections of the rotatable operation member are each shaped such that, when brought into contact with the detector as the rotatable operation member is being rotated in the first rotational direction, the switch driving sections move the detector in the first movement direction by at least the predetermined amount and then release the detector, which is biased to return to the origin position, and such that, when brought into contact with the detector as the rotatable operation member is being rotated in the second rotational direction, the switch driving sections move the detector in the second movement direction by at least the predetermined amount and then release the detector to return to the origin position.

2. The rotation detection device according to claim 1, wherein the rotation detection switch is disposed such that movement directions of the detector are orthogonal to the circumferential direction of rotation of the rotatable operation member.

3. The rotation detection device according to claim 1, wherein the rotation detection switch is disposed such that movement directions of the detector are closer to a direction orthogonal to the circumferential direction of rotation of the rotatable operation member than to the circumferential direction of rotation.

4. The rotation detection device according to claim 1 wherein the switch driving sections each have:

a first guide face that is inclined with respect to the circumferential direction of rotation of the rotatable operation member such that, when the rotatable operation member is rotated in the first rotational direction, the first guide face is brought into contact with the detector, and guides the detector in the first movement direction while sliding along the detector; and a second guide face that is inclined with respect to the circumferential direction of rotation of the rotatable operation member such that, when the rotatable operation member is rotated in the second rotational direction, the second guide face is brought into contact with the detector, and guides the detector in the second movement direction while sliding along the detector.

5. The rotation detection device according to claim 1 wherein the rotatable operation member has an arrangement face orthogonal to the operation central axis of the rotatable operation member, the switch driving sections protrude in a direction parallel to the operation central axis from the arrangement face, and the rotation detection switch is disposed such that, when the switch driving sections are brought into contact with the detector, the detector moves in a direction oblique to the direction of rotation of the rotatable operation member toward a radial direction of rotation.

6. The rotation detection device according to claim 1 wherein the rotatable operation member has an arrangement face orthogonal to the operation central axis of the rotatable operation member, the switch driving sections protrude in a direction parallel to the operation central axis from the arrangement face, and the rotation detection switch is disposed such that, when the switch driving sections are brought into contact with the detector, the detector moves in a direction closer to a radial direction of rotation of the rotatable operation member than to the circumferential direction of rotation.

7. The rotation detection device according to claim 1 wherein the rotatable operation member has an arrangement face orthogonal to the operation central axis of the rotatable operation member, the switch driving sections protrude in a direction parallel to the operation central axis from the arrangement face, and the rotation detection switch is disposed such that, when the switch driving sections are brought into contact with the detector, the detector moves in a radial direction of rotation.

8. The rotation detection device according to claim 1 wherein the rotatable operation member has a cylindrical arrangement face centered about the operation central axis of the rotatable operation member, the switch driving sections protrude in radial directions of rotation of the rotatable operation member from the arrangement face, and the rotation detection switch is disposed such that, when the switch driving sections are brought into contact with the detector, the detector moves in a direction oblique to the circumferential direction of rotation of the rotatable operation member and in a direction towards a direction parallel to the operation central axis.

9. The rotation detection device according to claim 1 wherein the rotatable operation member has a cylindrical arrangement face centered about an operation central axis of the rotatable operation member, the switch driving sections protrude in radial directions of rotation of the rotatable operation member from the arrangement face, and the rotation detection switch is disposed such that, when the switch driving sections are brought into contact with the detector, the detector moves in a direction closer to a direction parallel to the operation central axis than to the circumferential direction of rotation of the rotatable operation member.

10. The rotation detection device according to claim 1 wherein the rotatable operation member has a cylindrical arrangement face centered about an operation central axis of the rotatable operation member, the switch driving sections protrude in radial directions of rotation of the rotatable operation member from the arrangement face, and the rotation detection switch is disposed such that, when the switch driving sections are brought into contact with the detector, the detector moves in a direction closer to a direction parallel to the operation central axis than to the circumferential direction of rotation of the rotatable operation member.

11. A movement detection device, comprising:

a movement operation member configured to be moved in a first direction and a second direction opposite the first direction, about a given operation axis; and a movement detection switch configured to detect a movement direction and an amount of movement of the movement operation member;

wherein the movement operation member includes a plurality of switch driving sections that are intermittently arranged in a longitudinal direction of the movement operation member, the movement detection switch includes a detector, and a switch body that is configured to hold the detector such that the detector can move in both a first detection direction and a second detection direction opposite the first detection direction, from an origin position, the detector is configured to be biased toward the origin position such that each time the detector moves in the first detection direction or the second detection direction from the origin position by a predetermined amount, the movement detection switch outputs a detection signal corresponding to the movement direction, the movement detection switch is disposed in a posture in which the first detection direction and the second detection direction of the detector are in a direction oblique to the first and second directions at a position where the switch driving sections of the movement operation member can be brought into contact with the detector, and the switch driving sections of the movement operation member are each shaped such that, when brought into contact with the detector as the movement operation member is being moved in the first direction, the switch driving sections move the detector in the first detection direction by at least the predetermined amount and then release the detector, which is biased to return to the origin position, and such that, when brought into contact with the detector as the movement operation member is being moved in the second direction, the switch driving sections move the detector in the second detection direction by at least the predetermined amount and then release the detector to return to the origin position.

12. The movement detection device according to claim 11, wherein the movement detection switch is disposed such that detection directions of the detector are orthogonal to a longitudinal direction of the movement operation member.

13. The rotation detection device according to claim 11, wherein the movement detection switch is disposed such that detection directions of the detector are closer to a direction orthogonal to the longitudinal direction of the movement operation member than to the longitudinal direction of the movement operation member.

* * * * *